United States Patent [19]

Hasegawa et al.

[11] Patent Number: 5,025,229
[45] Date of Patent: Jun. 18, 1991

[54] VOLTAGE-CONTROLLED OSCILLATOR USING A SURFACE ELASTIC WAVE RESONATOR

[75] Inventors: Makoto Hasegawa, Tokyo; Kazuaki Takahashi, Kawasaki; Mitsuo Makimoto, Yokohama; Masao Takahashi, Chigasaki; Takayuki Shimazu, Kyoto, all of Japan

[73] Assignee: Matsushita Electric Industrial Co., Ltd., Japan

[21] Appl. No.: 528,079

[22] Filed: May 24, 1990

[30] Foreign Application Priority Data

Jun. 1, 1989 [JP] Japan .................................. 1-140452

[51] Int. Cl.⁵ .............................................. H03B 5/30
[52] U.S. Cl. .................................. 331/107 A; 331/75; 331/116 R; 331/177 V
[58] Field of Search ............ 331/107 A, 117 R, 116 R, 331/75, 177 V

[56] References Cited

U.S. PATENT DOCUMENTS 3,366,893  1/1968  Brunins .......................... 331/116 R
3,373,379  3/1968  Black ............................. 331/116 R

FOREIGN PATENT DOCUMENTS 63-117107  7/1988  Japan .......................... 331/107 A

*Primary Examiner*—Siegfried Grimm
*Attorney, Agent, or Firm*—Lowe, Price, LeBlanc & Becker

[57] ABSTRACT

A Colpitts oscillator has an integrated circuit. The integrated circuit includes a transistor having an equivalent large size, a bypass capacitor connected between a collector of the transistor and a ground, a first feedback capacitor connected between a base and an emitter of the transistor, a second feedback capacitor connected between the emitter of the transistor and the ground, and an emitter follower connected to the emitter of the transistor. In a package, a stray reactance and a bonding wire are designed so as to agree with an element value and a Q value which can be used as parts of a resonator. A surface elastic wave resonator disposed outside the integrated circuit is connected between the base of the transistor and the ground. The oscillator is voltage controlled by a variable capacitance diode connected in series with the resonator.

2 Claims, 1 Drawing Sheet

VOLTAGE-CONTROLLED OSCILLATOR USING A SURFACE ELASTIC WAVE RESONATOR

BACKGROUND OF THE INVENTION

This invention relates to a voltage-controlled oscillator.

In general, the oscillation frequency of an oscillator is determined by a resonator and also the equivalent capacitance of a bipolar-transistor circuit connected to the resonator. Thus, the oscillation frequency fluctuates with variations in the equivalent load capacitance.

Part of a Colpitts oscillator using a bipolar transistor can be realized by a semiconductor integrated circuit (IC). In such a Colpitts oscillator IC, a stray capacitance between a transistor collector and an IC substrate being a ground causes a problem. This stray capacitance includes a transistor pn junction capcitance. Thus, the stray capacitance depends on a temperature and a related voltage relative to the IC substrate. The stray capacitance composes a load capacitance connected to a resonator. Therefore, the oscillation frequency of the Colpitts oscillator fluctuates with variations in the temperature and the voltage.

Smaller-size and lower-price voltage-controlled oscillators have been demanded. A good way of satisfying this demand is to form at least part of the voltage-controlled oscillator by a semiconductor integrated circuit.

SUMMARY OF THE INVENTION

It is an object of this invention to provide an excellant voltage-controlled oscillator.

According to this invention, a Colpitts voltage-controlled oscillator comprises an integrated circuit including a transistor, a bypass capacitor connected between a collector of the transistor and a ground, a first feedback capacitor connected between a base and an emitter of the transistor, a second feedback capacitor connected between the emitter of the transistor and the ground, and an emitter follower connected to the emitter of the transistor; and a series combination of an inductor, a surface elastic wave resonator, and a variable capacitance diode, the series combination being disposed outside the integrated circuit and being connected between the base of the transistor and the ground.

DESCRIPTION OF THE PREFERRED EMBODIMENT

Figure 1:
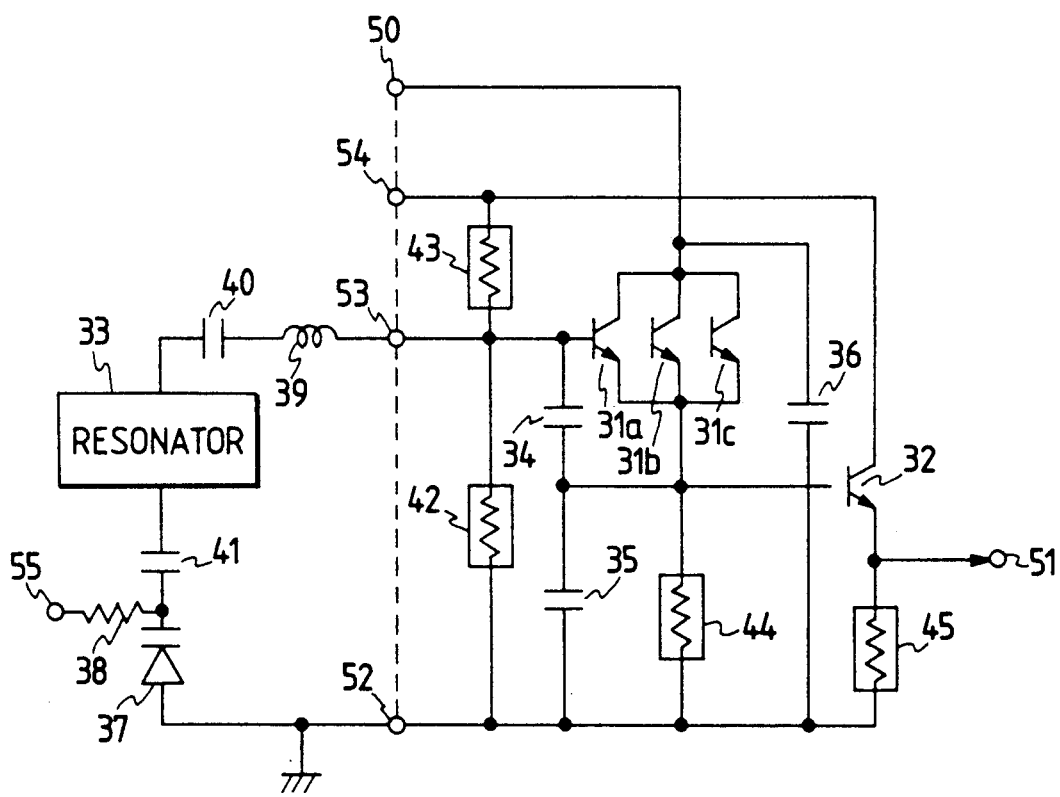
FIG. 1 is a schematic diagram of a voltage-controlled oscillator according to an embodiment of this invention.

With reference to FIG. 1, a voltage-controlled oscillator of the Colpitts type is basically divided into an IC section and a non-IC section. Circuit components within the IC section are formed on a common IC substrate.

As will be made clear later, this voltage-controlled oscillator uses the transistor-collector grounded type. This design prevents a stray capacitance between the collector and the IC substrate from causing the oscillation frequency to fluctuate with variations in the temperature and the voltage.

The IC section includes an array of NPN transistors 31a, 31b, and 31c connected in parallel. The collectors of the transistors 31a–31c are directly connected to a positive power supply terminal 50. One end of a collector grounding bypass capacitor 36 is connected to the collectors of the transistors 31a–31c, and the other end of the capacitor 36 is connected to a ground terminal 52. The bases of the transistors 31a–31c are directly connected to a terminal 53. One end of a first base bias resistor 42 is connected to the bases of the transistors 31a–31c, and the other end of the resistor 42 is connected to the ground terminal 52. One end of a second base bias resistor 43 is connected to a stabilized positive power supply terminal 54, and other end of the resistor 43 is connected to the bases of the transistors 31a–31c. The emitters of the transistors 31a–31c are connected to the ground terminal 52 via an emitter bias resistor 44. One end of a first feedback capacitor 324 is connected to the bases of the transistors 31a–31c, and other end of the capacitor 34 is connected to the emitters of the transistors 31a–31c. One end of a second feedback capacitor 35 is connected to the emitters of the transistors 31a–31c, and the other end of the capacitor 35 is connected to the ground terminal 52. The transistors 31a–31c compose an active element for the oscillator. The resistors 42–44 and the capacitors 34–36 are contained in the IC section.

The IC section includes another NPN transistor 32. The collector of the transistor 32 is connected to the stabilized positive power supply terminal 54. The base of the transistor 32 is connected to the emitters of the transistors 31a–31c. The emitter of the transistor 32 is connected to the ground terminal 52 via an emitter bias resistor 45. The junction between the emitter of the transistor 32 and the resistor 45 is connected to an output terminal 51. The combination of the transistor 32 and the resistor 45 compose an emitter follower serving as a buffer for isolation between the oscillator active part and a load. The resistor 45 is contained in the IC section.

The non-IC section includes a surface elastic wave resonator 33, a variable capacitance diode 37, a resistor 38, and inductor 39, and capacitors 40 and 41. The anode of the variable capacitance diode 37 is connected to the ground terminal 52 which is grounded. The cathode of the variable capacitance diode 37 is connected to one end of the resonator 33 via the capacitor 41. The other end of the reasonator 33 is connected to one end of the inductor 39 via the capacitor 40. The other end of the inductor 39 is connected to the terminal 53. One end of the resistor 38 is connected to a control terminal 55 subjected to a tuning voltage. The other end of the resistor 38 is connected to the junction between the variable capacitance diode 37 and the capacitor 41.

The parallel combination of the transistors 31a–31c enables low-noise oscillation. The parallel combination of the transistors 31a–31c may be replaced by a single transistor having a diffusion size which equals three or more times than that of a normal transistor for an amplifier.

An oscillation circuit except an active element includes the collector grounding capacitor 36, the feedback capacitors 34 and 35, and a resonant circuit. The resonant circuit includes the inductor 39, the resonator 33, and the variable capacitance diode 37. It is preferable that the resonance loss of the resonator 33 is equal to or less than about 1 dB. The Q of the resonator 33, the inductance of the inductor 39, the package reactance of the IC, and the characteristic of the variable capacitance diode 37 are preferably chosen so that the oscillation frequency can be varied by several MHz in response to a 1-volt change of the tuning voltage.

The oscillator active part including the transistors 31a–31c generates an oscillator signal. The oscillator signal is outputted from the oscillator active part via the emitter follower including the transistor 32. The oscillator signal is then outputted to an external circuit via the output terminal 51. A stabilized power supply voltage applied through the terminal 54 generates a stable base bias to the transistors 31a–31c and a stable collector voltage to the transistor 32 in order to ensure stable operation of the transistors 31a–31c and 32. The collector current of the transistors 31a–31c is fed from another power supply via the terminal 50. This design decreases the load of the stabilized power supply. A ripple filter is preferably connected between the terminal 50 and the power supply to enable low-noise oscillation.

What is claimed is:

1. A Colpitts voltage-controlled oscillator comprising:

an integrated circuit including a transistor comprising a parallel combination of sub transistors, a bypass capacitor connected between a collector of the transistor and a ground, a first feedback capacitor connected between a base and an emitter of the transistor, a second feedback capacitor connected between the emitter of the transistor and the ground, and an emitter follower connected to the emitter of the transistor; and a series combination of an inducer, a surface elastic wave resonator, and a variable capacitance diode, the series combination being disposed outside the integrated circuit and being connected between the base of the transistor and ground.

2. A Colpitts voltage-controlled oscillator comprising:

an integrated circuit including a transistor, a bypass capacitor connected between a collector of the transistor and a ground, a first feedback capacitor connected between a base and an emitter of the transistor, a second feedback capacitor connected between the emitter of the transistor and the ground, and an emitter follower connected to the emitter of the transistor; and a series combination of an inductor, a surface elastic wave resonator, and a variable capacitance diode, the series combination being disposed outside the integrated circuit and being connected between the base of the transistor and ground, said transistor having a diffusion size which equals three or more times that of a normal transistor for an amplifier.

* * * * *